(12) United States Patent
Deng

(10) Patent No.: US 10,985,714 B2
(45) Date of Patent: Apr. 20, 2021

(54) AMPLIFYING APPARATUS

(71) Applicant: RichWave Technology Corp., Taipei (TW)

(72) Inventor: Wei-Kung Deng, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/687,507

(22) Filed: Nov. 18, 2019

(65) Prior Publication Data
US 2021/0006214 A1 Jan. 7, 2021

(30) Foreign Application Priority Data

Jul. 2, 2019 (TW) .................................. 108123228

(51) Int. Cl.
*H03F 3/21* (2006.01)
*H03G 3/30* (2006.01)
(Continued)

(52) U.S. Cl.
CPC ............ *H03F 3/211* (2013.01); *H03F 1/0211* (2013.01); *H03F 1/565* (2013.01); *H03G 3/3042* (2013.01); *H03F 2200/222* (2013.01); *H03F 2200/318* (2013.01); *H03F 2200/387* (2013.01); *H03F 2200/451* (2013.01); *H03F 2203/21103* (2013.01); *H03F 2203/21106* (2013.01); *H03F 2203/21139* (2013.01); *H03G 2201/106* (2013.01); *H03G 2201/307* (2013.01)

(58) Field of Classification Search
CPC ....................................................... H03F 3/211
See application file for complete search history.

(56) References Cited

U.S. PATENT DOCUMENTS 7,417,508 B1 * 8/2008 Quaglietta ................ H03F 1/56
330/124 R
8,836,431 B2 9/2014 Han et al.
(Continued)

FOREIGN PATENT DOCUMENTS

| CN | 106998195 | 8/2017 |
|---|---|---|
| TW | 456100 | 9/2001 |
| TW | 201342796 | 10/2013 |

OTHER PUBLICATIONS

"Office Action of Taiwan Counterpart Application," dated Dec. 13, 2019, p. 1-p. 6.

*Primary Examiner* — Patricia T Nguyen
(74) *Attorney, Agent, or Firm* — JCIPRNET

(57) ABSTRACT

The disclosure provides an amplifying apparatus including a plurality of amplifying circuits and an adjusting circuit. The input terminals of the amplifying circuits are coupled to a first common node. The output terminals of the amplifying circuits are coupled to a second common node. The adjusting circuit adjusts an input signal to generate an adjusted signal to the first common node; the adjusting circuit adjusts the signal of the second common node; or the adjusting circuit adjusts the input signal to generate the adjusted signal to the first common node and adjusts the signal of the second common node. The first control signal and the second control signal respectively control the amplifying circuits and the adjusting circuit to determine the gain, the linear power, and the output current of the amplifying apparatus.

20 Claims, 8 Drawing Sheets

(51) Int. Cl.
*H03F 1/56* (2006.01)
*H03F 1/02* (2006.01)

(56) References Cited

U.S. PATENT DOCUMENTS

| | | | |
|---|---|---|---|
| 9,793,865 B2 | 10/2017 | Blair et al. | |
| 2011/0070848 A1* | 3/2011 | Ramachandra Reddy | H03F 1/0277 455/127.2 |
| 2016/0065141 A1* | 3/2016 | Yoshikawa | H03F 3/19 330/295 |
| 2016/0126987 A1* | 5/2016 | Wloczysiak | H04B 1/18 375/347 |
| 2018/0042073 A1* | 2/2018 | Scott | H05B 6/6467 |
| 2018/0138878 A1* | 5/2018 | Domino | H03G 3/3042 |
| 2018/0138990 A1* | 5/2018 | Bergsma | H04B 1/18 |
| 2019/0108979 A1* | 4/2019 | Higuchi | H01J 37/32183 |
| 2019/0363680 A1* | 11/2019 | Yoo | H03F 3/005 |
| 2020/0127610 A1* | 4/2020 | Kusuda | H03F 3/45488 |

* cited by examiner

AMPLIFYING APPARATUS

CROSS-REFERENCE TO RELATED APPLICATION

This application claims the priority benefit of Taiwan application serial no. 108123228, filed on Jul. 2, 2019. The entirety of the above-mentioned patent application is hereby incorporated by reference herein and made a part of this specification.

BACKGROUND

Technical Field

The disclosure relates to an electronic circuit, and more particularly to an amplifying apparatus capable of adjusting a gain, a linear power, and an output current.

Description of Related Art

When a power amplifier (PA) apparatus is operated in a "gain reduction and backoff mode", the power added efficiency (PAE) of a conventional power amplifier apparatus usually drops, causing PA characteristics to be degraded. On the other hand, the gain of the conventional power amplifier apparatus is not easy to adjust and the gain is also difficult to be reduced appropriately by changing the bias. The usual practice is to use an attenuator at the input terminal (or output terminal) of the power amplifier, so as to achieve the purpose of changing the gain. However, the method makes it can't to reduce the output current of the power amplifier. Therefore, it is difficult to improve the PAE of the conventional power amplifier apparatus due to a reduction in the gain.

It should be noted that the content under the "Description of Related Art" section is intended to aid in understanding the disclosure. Some of the content (or all of the content) disclosed in the "Description of Related Art" section may not be conventional technology known to persons with ordinary skill in the art. The content disclosed in the "Description of Related Art" section does not represent that the content is known to persons with ordinary skill in the art prior to the application of the disclosure.

SUMMARY

The disclosure provides an amplifying apparatus. The amplifying apparatus includes a plurality of amplifying circuits and an adjusting circuit. The input terminal of each of the amplifying circuits is coupled to a first common node. The output terminal of each of the amplifying circuits is coupled to a second common node. The adjusting circuit is configured to adjust an input signal to generate an adjusted signal to the first common node; the adjusting circuit is configured to adjust a signal of the second common node; or the adjusting circuit is configured to adjust the input signal to generate the adjusted signal to the first common node and to adjust the signal of the second common node. Wherein the amplifying circuits are controlled by a first control signal and the adjusting circuit is controlled by a second control signal. The first control signal and the second control signal are used to determine a first operating mode and a second operating mode of the amplifying apparatus. The gain and the output current of the amplifying apparatus in the first operating mode are greater than the gain and the output current of the amplifying apparatus in the second operating mode.

To make the aforementioned and other features of the disclosure more comprehensible, several embodiments accompanied with drawings are described in detail as follows.

DETAILED DESCRIPTION OF DISCLOSED EMBODIMENTS

Figure 1:
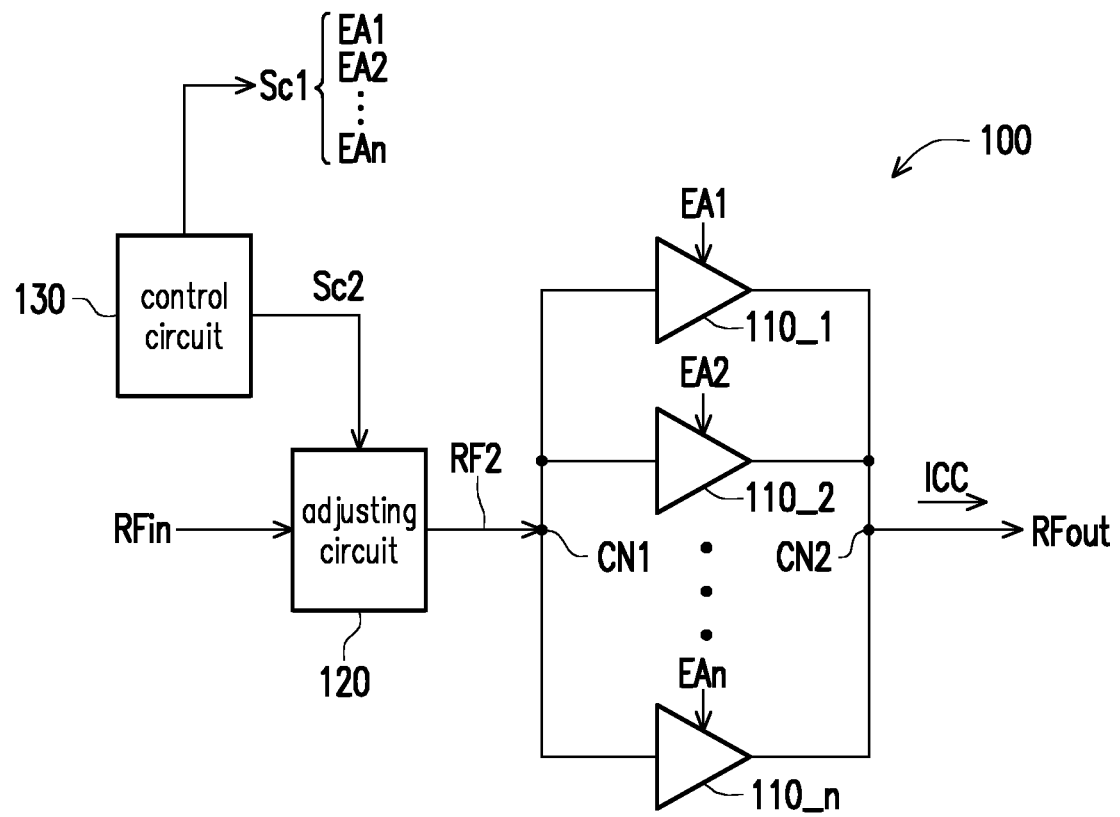
FIG. 1 is a schematic diagram of a circuit block of an amplifying apparatus in accordance with an embodiment of the disclosure.

The term "coupled (or connected)" as used throughout the specification (including the claims) may be used to indicate any direct or indirect means of connection. For example, if a first apparatus is coupled (or connected) to a second apparatus, it should be interpreted that the first apparatus may be directly connected to the second apparatus or the first apparatus may be indirectly connected to the second apparatus through another apparatus or a certain means of connection. The terms "first" and "second" recited throughout the specification (including the claims) are used to name the elements or to distinguish different embodiments or scopes, and are not used to limit the upper limit or lower limit of the number of elements and are also not used to limit the order of the elements. In addition, wherever possible, the elements/components/steps using the same reference numeral in the drawings and the embodiments represent the same or similar parts. Cross-referencing to relevant descriptions may be made for the elements/components/steps using the same reference numeral or the same term in different embodiments.

FIG. 1 is a schematic diagram of a circuit block of an amplifying apparatus 100 in accordance with an embodiment of the disclosure. The amplifying apparatus 100 shown in FIG. 1 includes a plurality of amplifying circuits (such as 110_1, 110_2, . . . , 110_n) and an adjusting circuit 120. The input terminal of each of the amplifying circuits 110_1 to 110_n is coupled to a common node CN1. The output terminal of each of the amplifying circuits 110_1 to 110_n is coupled to a common node CN2. The amplifying circuits 110_1 to 110_n may amplify a signal to output a radio frequency (RF) signal RFout. The embodiment does not limit the implementation details of the amplifying circuits 110_1 to 110_n. According to design requirements, each of the amplifying circuits 110_1 to 110_n may include a conventional power amplifier (PA) or other type of amplifier/amplifying circuit.

A control circuit 130 is coupled to the amplifying circuits 110_1 to 110_n to provide a control signal Sc1. The amplifying circuits 110_1 to 110_n are controlled by the control signal Sc1 to adjust a linear power and an output current ICC of the amplifying apparatus 100. For example, the amplifying circuits 110_1 to 110_n may determine whether the operating mode of the amplifying apparatus 100 is the first operating mode or the second operating mode according to the control signal Sc1. The output current ICC of the amplifying apparatus 100 in the first operating mode is greater than the output current ICC of the amplifying apparatus 100 in the second operating mode. According to design requirements, the first operating mode includes a normal operating mode, and the second operating mode includes a gain reduction and backoff mode.

For example, in the embodiment shown in FIG. 1, the control signal Sc1 may include or be used to generate enable signals EA1, EA2, . . . , EAn of each of the amplifying circuits 110_1 to 110_n. With the enable signals EA1 to EAn, the control circuit 130 may selectively enable or disable one, a plurality of, or all of the amplifying circuits 110_1 to 110_n. For example, the number of enabled amplifying circuits in the amplifying circuits 110_1 to 110_n when the amplifying apparatus 100 is operating in the first operating mode (for example, the normal operating mode) is greater than the number of enabled amplifying circuits in the amplifying circuits 110_1 to 110_n when the amplifying apparatus is operating in the second operating mode (for example, the gain reduction and backoff mode). By disabling some of the amplifying circuits 110_1 to 110_n, the linear power and the output current ICC of the amplifying apparatus 100 may be reduced.

Figure 2:
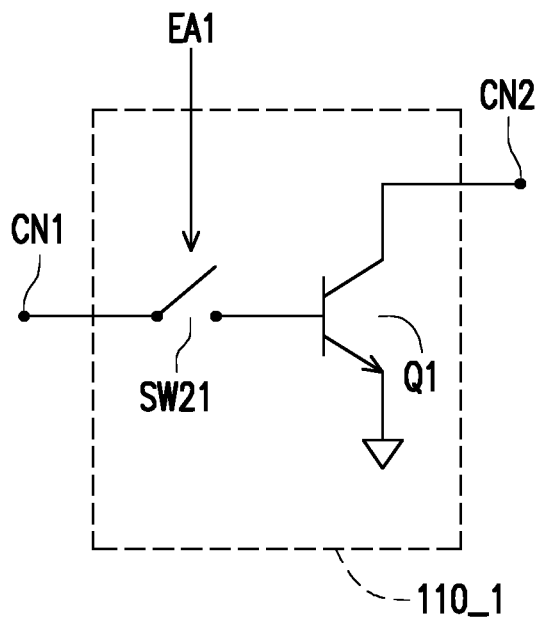
FIG. 2 is a schematic diagram of a circuit block of an amplifying circuit shown in FIG. 1 in accordance with an embodiment of the disclosure.

FIG. 2 is a schematic diagram of a circuit block of an amplifying circuit 110_1 shown in FIG. 1 in accordance with an embodiment of the disclosure. Other amplifying circuits 110_2 to 110_n may be analogized with reference to the relevant descriptions of the amplifying circuit 110_1. For convenience of illustration, FIG. 2 only shows a switch SW21 and an input transistor Q1 of the amplifying circuit 110_1. The first terminal of the switch SW21 is coupled to the common node CN1. The switch SW21 is controlled by the enable signal EA1. The control terminal of the input transistor Q1 is coupled to the second terminal of the switch SW21. When the switch SW21 is turned on, the amplifying circuit 110_1 is enabled. When the switch SW21 is turned off, the amplifying circuit 110_1 is disabled. It should be noted that the number of input transistors of the amplifying circuits 110_1 to 110_n may be any integer and the number of input transistors included in the amplifying circuits 110_1 to 110_n may be the same or different.

Figure 3A:
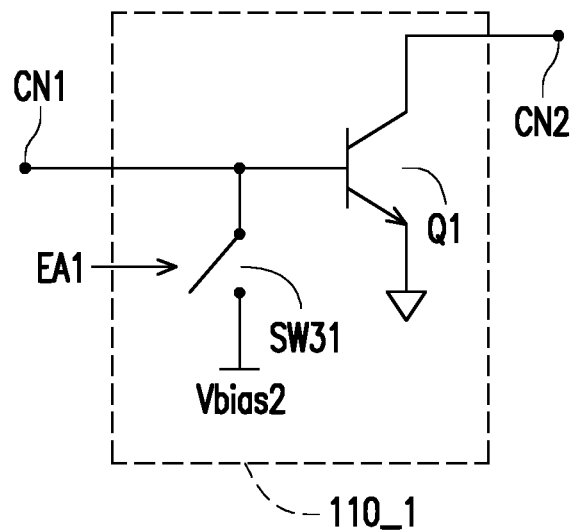
FIG. 3A is a schematic diagram of the circuit block of the amplifying circuit shown in FIG. 1 in accordance with another embodiment of the disclosure.

FIG. 3A is a schematic diagram of the circuit block of the amplifying circuit 110_1 shown in FIG. 1 in accordance with another embodiment of the disclosure. Other amplifying circuits 110_2 to 110_n may be analogized with reference to the relevant descriptions of the amplifying circuit 110_1. For convenience of illustration, FIG. 3A only shows a switch SW31 and the input transistor Q1 of the amplifying circuit 110_1. The control terminal of the input transistor Q1 is coupled to the common node CN1. The first terminal of the switch SW31 is coupled to the control terminal of the input transistor Q1. The second terminal of the switch SW31 is coupled to a bias voltage terminal Vbias2. The voltage level of the bias voltage terminal Vbias2 may be determined according to design requirements. The switch SW31 is controlled by the enable signal EA1 When switch SW31 is turned off, the input transistor Q1 is turned off, so the amplifying circuit 110_1 is disabled. When the switch SW31 is turned on, the voltage of the bias voltage terminal Vbias2 may turn on the input transistor Q1. That is, the operation of the input transistor Q1 returns to normal, so the amplifying circuit 110_1 is enabled.

Figure 3B:
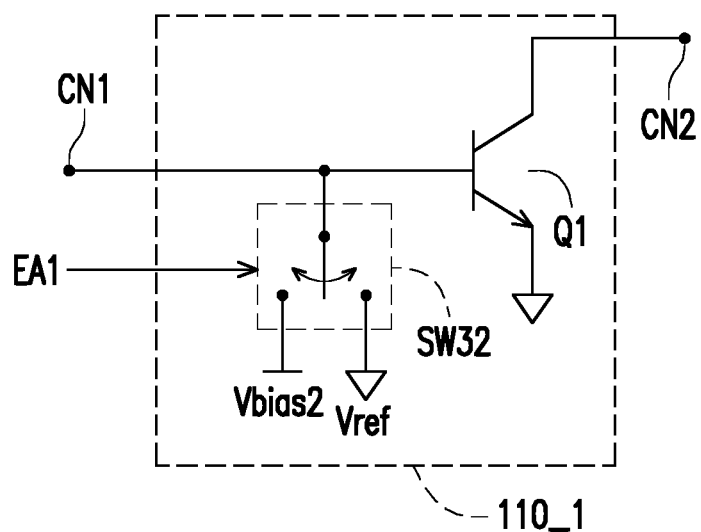
FIG. 3B is a schematic diagram of the circuit block of the amplifying circuit shown in FIG. 1 in accordance with yet another embodiment of the disclosure.

FIG. 3B is a schematic diagram of the circuit block of the amplifying circuit 110_1 shown in FIG. 1 in accordance with yet another embodiment of the disclosure. Other amplifying circuits 110_2 to 110_n may be analogized with reference to the relevant descriptions of the amplifying circuit 110_1. For convenience of illustration, FIG. 3B only shows a switching circuit SW32 and the input transistor Q1 of the amplifying circuit 110_1. The control terminal of the input transistor Q1 is coupled to the common node CN1. The common terminal of the switching circuit SW32 is coupled to the control terminal of the input transistor Q1. The first selective terminal of the switching circuit SW32 is coupled to the bias voltage terminal Vbias2. The voltage level of the bias voltage terminal Vbias2 may be determined according to design requirements. The switching circuit SW32 is controlled by the enable signal EA1. When the switching circuit SW32 couples the common terminal to the first selective terminal, the switching circuit SW32 transmits the voltage of the bias voltage terminal Vbias2 to the control terminal of the input transistor Q1. At this time, the voltage of the bias voltage terminal Vbias2 may turn on the input transistor Q1. That is, the operation of the input transistor Q1 returns to normal, so the amplifying circuit 110_1 is enabled.

The second selective terminal of the switching circuit SW32 is coupled to a reference voltage terminal Vref. According to design requirements, in some embodiments, the voltage level of the reference voltage terminal Vref may be a ground voltage. When the switching circuit SW32 couples the common terminal to the second selective terminal, the switching circuit SW32 transmits the voltage of the reference voltage terminal Vref to the control terminal of the input transistor Q1. When the switching circuit SW32 transmits the voltage of the reference voltage terminal Vref to the control terminal of the input transistor Q1, the input transistor Q1 is turned off. Therefore, the amplifying circuit 110_1 is disabled.

The implementation method of "the control signal Sc1 controlling the amplifying circuits 110_1 to 110_n" should not be limited to the example shown in FIG. 1. In other embodiments, the control signal Sc1 may include the bias of each of the amplifying circuits 110_1 to 110_n. The bias voltage generating circuit of the control circuit 130 may generate a corresponding bias (the control signal Sc1) to the control terminal of the input transistor of each of the amplifying circuits 110_1 to 110_n. Based on the adjustment of the biases, the amplifying circuits 110_1 to 110_n may adjust the linear power and the output current ICC of the amplifying apparatus 100.

Figure 4:
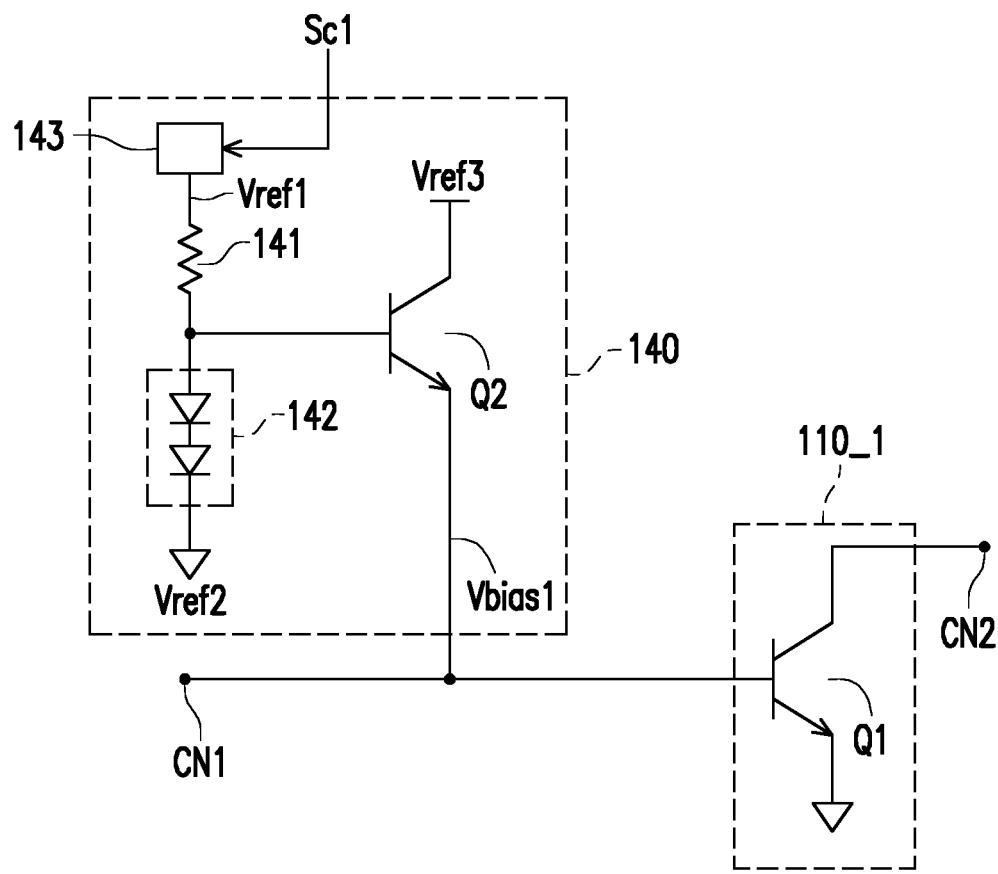
FIG. 4 is a schematic diagram of circuit blocks of an amplifying circuit and a bias voltage generating circuit in accordance with another embodiment of the disclosure.

In other embodiments, the control signal Sc1 may control the bias voltage generating circuit to generate the corresponding bias to the control terminal of the input transistor of each of the amplifying circuits 110_1 to 110_n. For example, FIG. 4 is a schematic diagram of circuit blocks of the amplifying circuit 110_1 and a bias voltage generating circuit 140 in accordance with another embodiment of the disclosure. Other amplifying circuits 110_2 to 110_n may be analogized with reference to the relevant descriptions of the amplifying circuit 110_1. For convenience of illustration, FIG. 4 only shows the input transistor Q1 of the amplifying circuit 110_1. The bias voltage generating circuit 140 may generate a bias Vbias1 to the control terminal of the input transistor Q1 of the amplifying circuit 110_1. Wherein the bias voltage generating circuit 140 is controlled by the control signal Sc1 to adjust the bias Vbias1. Based on the adjustment of the bias Vbias1, the amplifying circuit 110_1 may adjust the linear power and the output current ICC of the amplifying apparatus 100.

In the embodiment shown in FIG. 4, the bias voltage generating circuit 140 includes a reference voltage circuit 143, a resistance circuit 141, a diode circuit 142, and a transistor Q2. The reference voltage circuit 143 is controlled by the control signal Sc1 to adjust and output the reference voltage Vref1. For example, in some embodiments, when the control signal Sc1 is of a first logic state (for example, a high logic level), the reference voltage circuit 143 outputs the reference voltage Vref1 (the reference voltage Vref1 may be a fixed voltage determined according to design requirements); and when the control signal Sc1 is of a second logic state (for example, a low logic level), the reference voltage circuit 143 does not output the reference voltage Vref1. In other embodiments, the reference voltage circuit 143 may dynamically adjust the reference voltage Vref1 according to the control signal Sc1 (the reference voltage Vref1 may be a dynamic analog voltage).

The first terminal of the resistance circuit 141 is coupled to the reference voltage circuit 143 to receive the reference voltage Vref1. The first terminal of the diode circuit 142 is coupled to the second terminal of the resistance circuit 141. The second terminal of the diode circuit 142 is coupled to a reference voltage terminal Vref2. According to design requirements, in some embodiments, the voltage level of the reference voltage terminal Vref2 may be a ground voltage or other fixed voltage. The control terminal of the transistor Q2 is coupled to the second terminal of the resistance circuit 141. The first terminal of transistor Q2 is coupled to a reference voltage terminal Vref3. According to design requirements, in some embodiments, the voltage level of the reference voltage terminal Vref3 may be a system voltage or other power voltage. The second terminal of transistor Q2 is coupled to the control terminal of input transistor Q1. In another embodiment, the diode circuit 142 may be implemented using a diode-connected transistor.

Please refer to FIG. 1. According to design requirements, the input terminal of the adjusting circuit 120 may be coupled to another amplifying apparatus (not shown) or the output terminal of other circuit. In the embodiment shown in FIG. 1, the adjusting circuit 120 is configured to adjust an input signal (for example, an RF signal RFin) to generate an adjusted signal RF2 to the common node CN1. The control circuit 130 is coupled to the adjusting circuit 120 to provide a control signal Sc2. The adjusting circuit 120 is controlled by the control signal Sc2 to adjust the gain of the amplifying apparatus 100. The gain and/or the linear power of the amplifying apparatus 100 may be reduced (or increased) by the control signal Sc2.

The control signal Sc1 and the control signal Sc2 are used to determine the operating mode of the amplifying apparatus 100. For example, the amplifying circuits 110_1 to 110_n and the adjusting circuit 120 may determine whether the operating mode of the amplifying apparatus 100 is the first operating mode or the second operating mode according to the control signal Sc1 and the control signal Sc2. The gain of the amplifying apparatus 100 in the first operating mode is greater than the gain of the amplifying apparatus 100 in the second operating mode and the output current ICC of the amplifying apparatus 100 in the first operating mode is greater than the output current ICC of the amplifying apparatus 100 in the second operating mode. In some embodiments, the linear power of the amplifying apparatus 100 in the first operating mode is greater than the linear power of the amplifying apparatus 100 in the second operating mode. According to operational requirements, the first operating mode includes a normal operating mode and the second operating mode includes the gain reduction and backoff mode.

Figure 5:
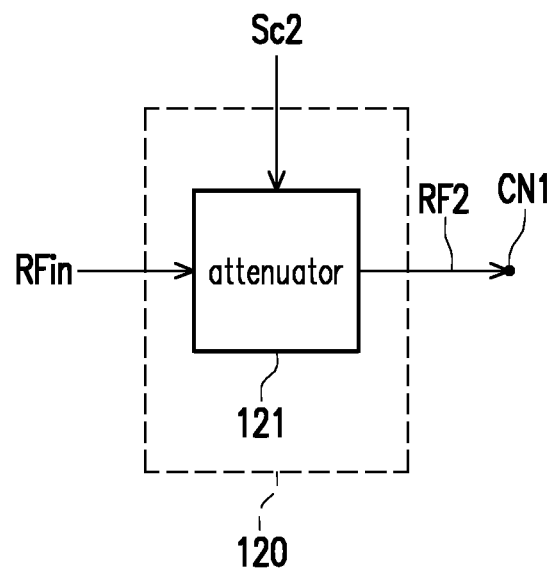
FIG. 5 is a schematic diagram of a circuit block of an adjusting circuit shown in FIG. 1 in accordance with an embodiment of the disclosure.

FIG. 5 is a schematic diagram of a circuit block of an adjusting circuit 120 shown in FIG. 1 in accordance with an embodiment of the disclosure. The adjusting circuit 120 shown in FIG. 5 includes an attenuator 121. The attenuator 121 may attenuate the input signal (for example, the RF signal RFin) to generate an attenuated signal (for example, the adjusted signal RF2). The attenuator 121 is controlled by the control signal Sc2 to adjust the gain of the amplifying apparatus 100. By the control signal Sc2, the control circuit 130 may adjust the attenuation degree of the attenuator 121. By increasing the attenuation degree of the attenuator 121, the gain of the amplifying apparatus 100 may be reduced. The embodiment does not limit the implementation details of the attenuator 121. For example, according to design requirements, the attenuator 121 may be a conventional attenuator or other signal attenuating circuit.

Figure 6:
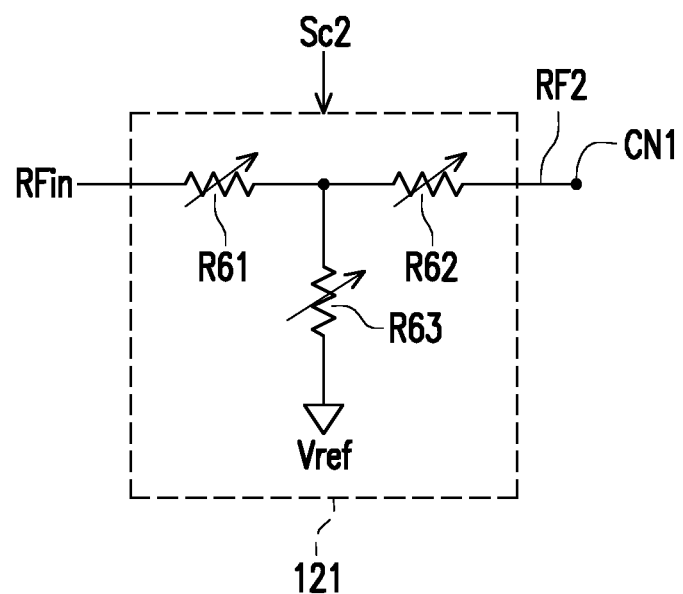
FIG. 6 is a schematic diagram of a circuit block of an attenuator shown in FIG. 5 in accordance with an embodiment of the disclosure.

FIG. 6 is a schematic diagram of a circuit block of the attenuator 121 shown in FIG. 5 in accordance with an embodiment of the disclosure. In the embodiment shown in FIG. 6, the attenuator 121 includes a resistor R61, a resistor R62, and a resistor R63. The first terminal of the resistor R61 receives an input signal (for example, the RF signal RFin). The first terminal of the resistor R62 is coupled to the second terminal of the resistor R61. The second terminal of the resistor R62 is coupled to the common node CN1. The first terminal of the resistor R63 is coupled to the second terminal of the resistor R61. The second terminal of the resistor R63 is coupled to the reference voltage terminal Vref. According to design requirements, in some embodiments, the voltage level of the reference voltage terminal Vref may be a ground voltage. The resistance of one or more than one of the resistor R61, the resistor R62, and the resistor R63 may change according to the control of the control signal Sc2. The embodiment does not limit the implementation details of "changing the resistance of the resistor". For example, in some embodiments, "changing the resistance of the resistor" may be a conventional technique, and thus will not be reiterated herein.

Figure 7:
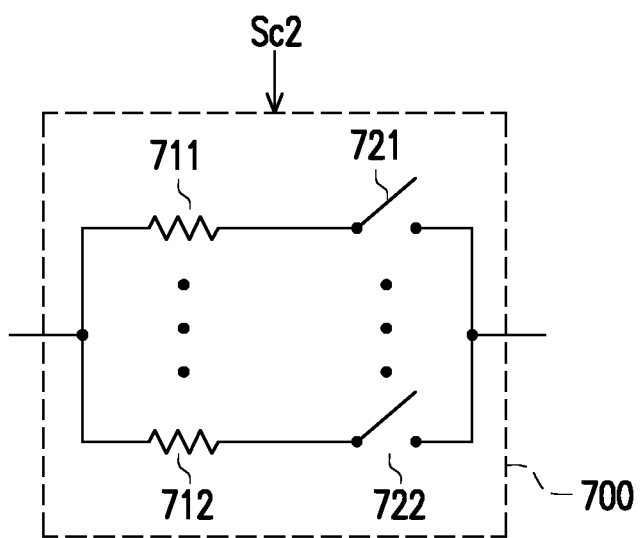
FIG. 7 is a schematic diagram of a circuit block of a resistor in accordance with an embodiment of the disclosure.

FIG. 7 is a schematic diagram of a circuit block of a resistor 700 in accordance with an embodiment of the disclosure. The resistor 700 shown in FIG. 7 may be any one of the resistor R61, the resistor R62, and the resistor R63 shown in FIG. 6. In the embodiment shown in FIG. 7, the resistor 700 includes a plurality of resistor units (for example, 711 and 712 shown in FIG. 7) and a plurality of switches (for example, 721 and 722 shown in FIG. 7). The first terminals of the resistor units 711 and 712 are electrically connected to each other as the first terminal of the resistor 700. The first terminal of each of the switches 721 and 722 is coupled to the second terminal of a corresponding resistor unit in the resistor units 711 and 712. The second terminals of the switches 721 and 722 are electrically connected to each other as the second terminal of the resistor 700. The switches 721 and 722 are controlled by the control signal Sc2.

Figure 8:
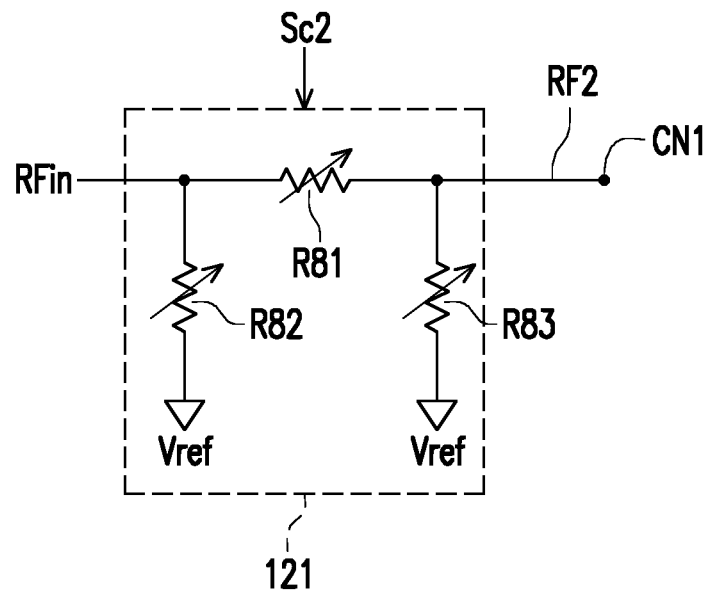
FIG. 8 is a schematic diagram of the circuit block of the attenuator shown in FIG. 5 in accordance with another embodiment of the disclosure.

FIG. 8 is a schematic diagram of the circuit block of the attenuator 121 shown in FIG. 5 in accordance with another embodiment of the disclosure. In the embodiment shown in FIG. 8, the attenuator 121 includes a resistor R81, a resistor R82, and a resistor R83. The first terminal of the resistor R81 receives an input signal (for example, the RF signal RFin). The second terminal of the resistor R81 is coupled to the common node CN1. The first terminal of the resistor R82 is coupled to the first terminal of the resistor R81. The second terminal of the resistor R82 is coupled to the reference voltage terminal Vref. The first terminal of the resistor R83 is coupled to the second terminal of the resistor R81. The second terminal of the resistor R83 is coupled to the reference voltage terminal Vref. According to design requirements, in some embodiments, the voltage level of the reference voltage terminal Vref may be a ground voltage. The resistance of one or more than one of the resistor R81, the resistor R82, and the resistor R83 may vary according to the control of the control signal Sc2. According to design requirements, in some embodiments, the resistor R81, the resistor R82, and/or the resistor R83 shown in FIG. 8 may be analogized with reference to the relevant descriptions of the resistor 700 shown in FIG. 7.

Figure 9:
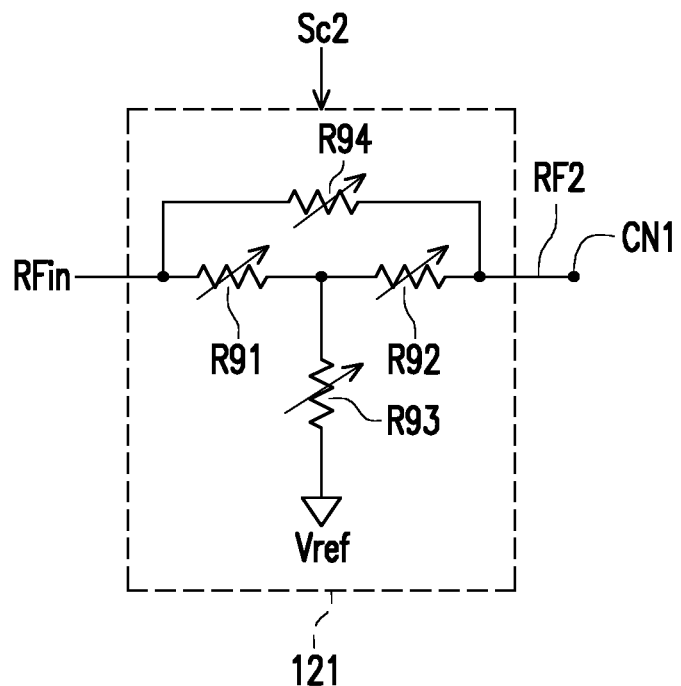
FIG. 9 is a schematic diagram of the circuit block of the attenuator shown in FIG. 5 in accordance with yet another embodiment of the disclosure.

FIG. 9 is a schematic diagram of the circuit block of the attenuator 121 shown in FIG. 5 in accordance with yet another embodiment of the disclosure. In the embodiment shown in FIG. 9, the attenuator 121 includes a resistor R91, a resistor R92, a resistor R93, and a resistor R94. The first terminal of the resistor R91 receives an input signal (for example, the RF signal RFin). The first terminal of the resistor R92 is coupled to the second terminal of the resistor R91. The second terminal of the resistor R92 is coupled to the common node CN1. The first terminal of the resistor R93 is coupled to the second terminal of the resistor R91. The second terminal of the resistor R93 is coupled to the reference voltage terminal Vref. According to design requirements, in some embodiments, the voltage level of the reference voltage terminal Vref may be a ground voltage. The first terminal of the resistor R94 receives an input signal (for example, the RF signal RFin). The second terminal of the resistor R94 is coupled to the common node CN1. The resistance of one or more than one of the resistor R91, the resistor R92, the resistor R93, and the resistor R94 may vary according to the control of the control signal Sc2. According to design requirements, in some embodiments, the resistor R91, the resistor R92, the resistor R93, and/or the resistor R94 shown in FIG. 9 may be analogized with reference to the relevant descriptions of the resistor 700 shown in FIG. 7.

Figure 10:
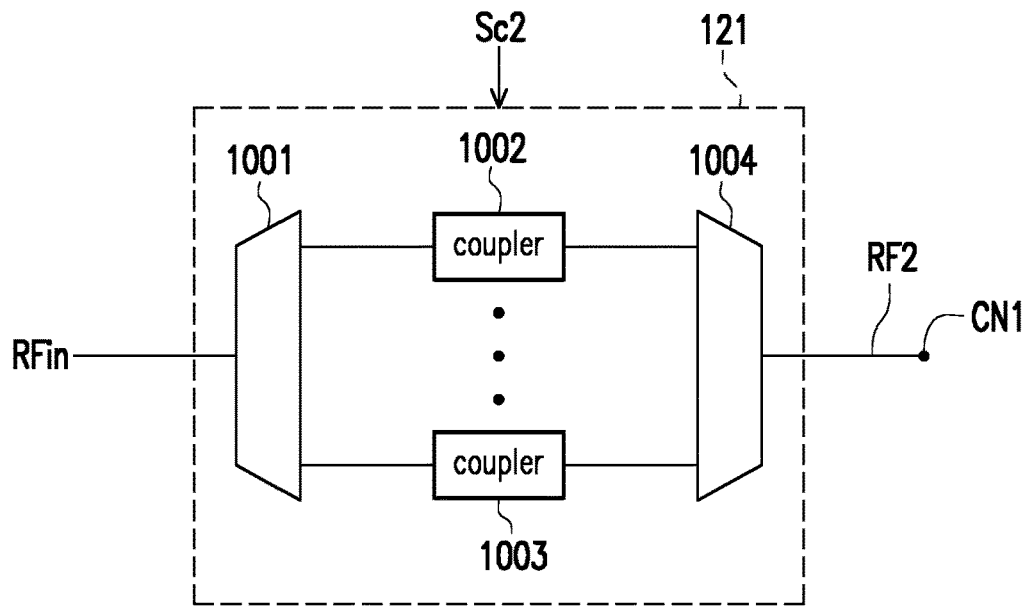
FIG. 10 is a schematic diagram of the circuit block of the attenuator shown in FIG. 5 in accordance with still another embodiment of the disclosure.

FIG. 10 is a schematic diagram of the circuit block of the attenuator 121 shown in FIG. 5 in accordance with still another embodiment of the disclosure. In the embodiment shown in FIG. 10, the attenuator 121 includes a demultiplexer 1001, a plurality of couplers (for example, 1002 and 1003 shown in FIG. 10), and a multiplexer 1004. The common terminal of the demultiplexer 1001 receives an input signal (for example, the RF signal RFin). The first terminal of each of the couplers 1002 and 1003 is coupled to a corresponding selective terminal in a plurality of selective terminals of the demultiplexer 1001. The second terminal of each of the couplers 1002 and 1003 is coupled to a corresponding selective terminal in a plurality of selective terminals of the multiplexer 1004. According to design requirements, the couplers 1002 and 1003 may be conventional RF couplers or other coupling circuits. The attenuation amount of the couplers 1002 and 1003 is at least partially different from each other. In some embodiments, the attenuation amount of the couplers 1002 and 1003 may also be different from each other. The attenuation amount of the couplers 1002 and 1003 may be determined according to design requirements. The common terminal of the multiplexer 1004 is coupled to the common node CN1. The demultiplexer 1001 and the multiplexer 1004 change routing according to the control of the control signal Sc2.

Figure 11:
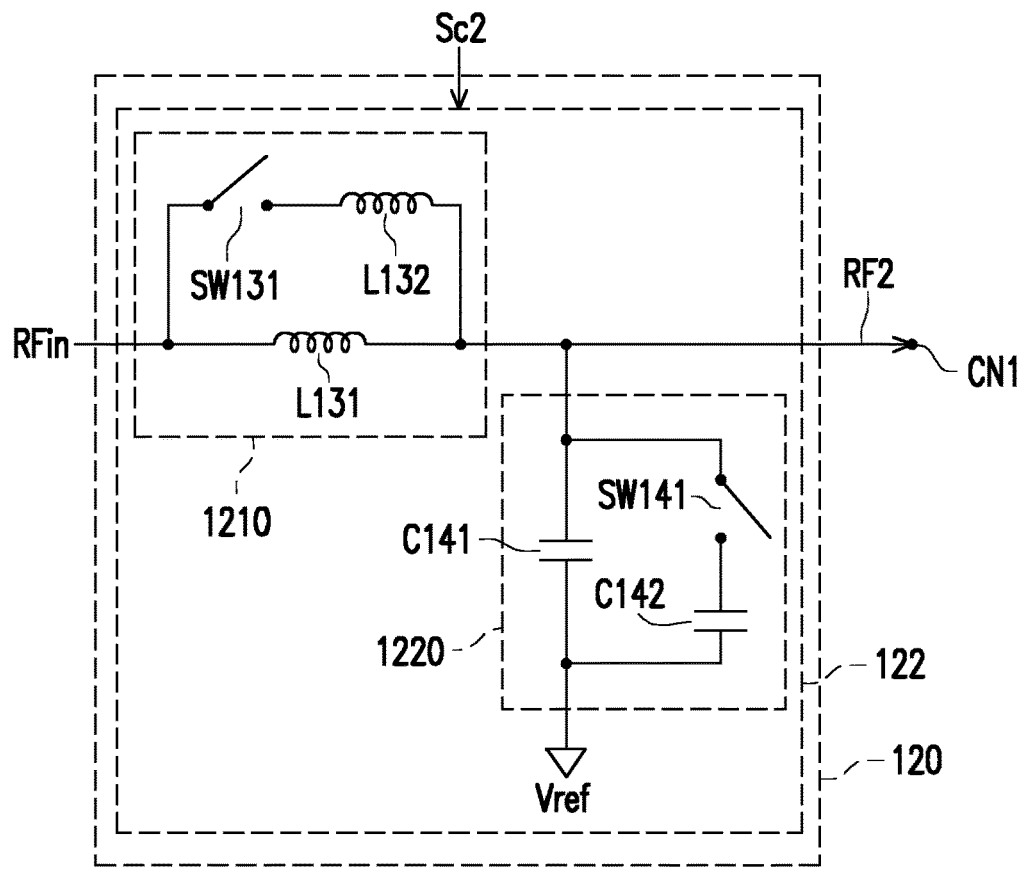
FIG. 11 is a schematic diagram of the circuit block of the adjusting circuit shown in FIG. 1 in accordance with another embodiment of the disclosure.

FIG. 11 is a schematic diagram of the circuit block of the adjusting circuit 120 shown in FIG. 1 in accordance with another embodiment of the disclosure. The adjusting circuit 120 shown in FIG. 11 includes an interstage tuning circuit 122. The interstage tuning circuit 122 may tune an input signal (for example, the RF signal RFin) to generate a tuned signal (for example, the adjusted signal RF2). The interstage tuning circuit 122 is controlled by the control signal Sc2 to adjust the gain and/or the linear power of the amplifying apparatus 100. By the control signal Sc2, the control circuit 130 may adjust the characteristics of the interstage tuning circuit 122. The interstage tuning circuit 122 may tune the input impedance of the current stage and/or tune the output impedance of the previous stage, so as to facilitate impedance matching. By controlling the interstage tuning circuit 122, the gain and/or the linear power of the amplifying apparatus 100 may be reduced. The embodiment does not limit the implementation details of the interstage tuning circuit 122. For example, according to design requirements, the interstage tuning circuit 122 may be a conventional matching tuning circuit or other signal tuning circuit.

In the embodiment shown in FIG. 11, the interstage tuning circuit 122 includes an induction circuit 1210 and a capacitance circuit 1220. The first terminal of the induction circuit 1210 receives an input signal (for example, the RF signal RFin). The second terminal of the induction circuit 1210 is coupled to the common node CN1. The first terminal of the capacitance circuit 1220 is coupled to the second terminal of the induction circuit 1210. The second terminal of the capacitance circuit 1220 is coupled to the reference voltage terminal Vref. According to design requirements, in some embodiments, the voltage level of the reference voltage terminal Vref may be a ground voltage. One or both of the inductance value of the induction circuit 1210 and the capacitance value of the capacitance circuit 1220 may vary according to the control of the control signal Sc2. The embodiment does not limit the implementation details of the induction circuit 1210 and the capacitance circuit 1220. For example, according to design requirements, the induction circuit 1210 may be a conventional variable inductor or other variable inductor, and/or the capacitance circuit 1220 may be a conventional variable capacitor or other variable capacitor.

In the embodiment shown in FIG. 11, the induction circuit 1210 includes an inductor L131, a switch SW 131, and an inductor L132. The first terminal of the inductor L131 receives an input signal (for example, the RF signal RFin). The second terminal of the inductor L131 is coupled to the common node CN1. The first terminal of the switch SW131 is coupled to the first terminal of the inductor L131. The switch SW131 is controlled by the control signal Sc2. The first terminal of inductor L132 is coupled to the second terminal of the switch SW131. The second terminal of the inductor L132 is coupled to the second terminal of the inductor L131.

In the embodiment shown in FIG. 11, the capacitance circuit 1220 includes a capacitor C141, a switch SW 141, and a capacitor C142. The first terminal of the capacitor C141 is coupled to the second terminal of the induction circuit 1210. The second terminal of the capacitor C141 is coupled to the reference voltage terminal Vref. The first terminal of the switch SW141 is coupled to the first terminal of the capacitor C141. The switch SW 141 is controlled by the control signal Sc2. The first terminal of the capacitor C142 is coupled to the second terminal of the switch SW141. The second terminal of the capacitor C142 is coupled to the reference voltage terminal Vref. According to design requirements, in some embodiments, the voltage level of the reference voltage terminal Vref may be a ground voltage.

Figure 12:
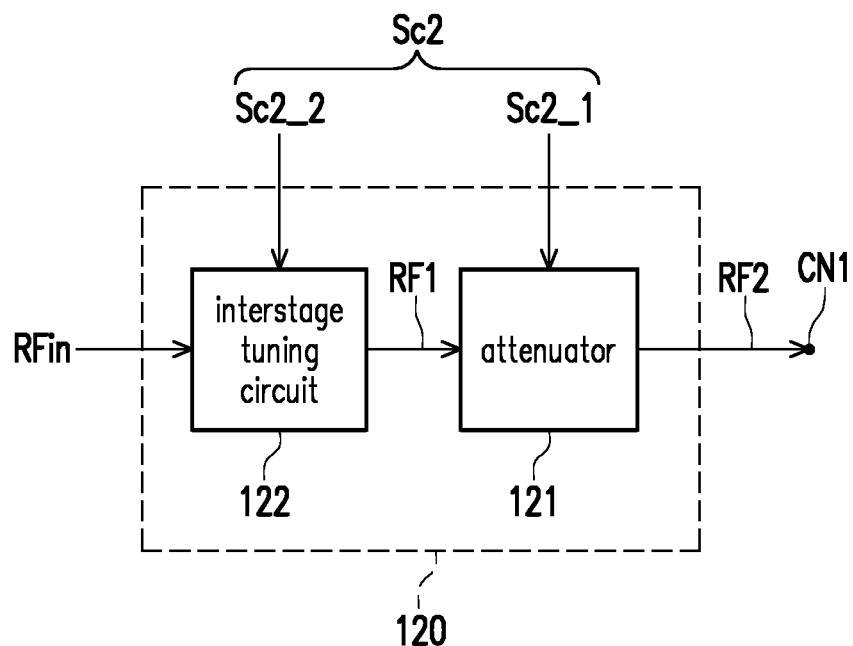
FIG. 12 is a schematic diagram of the circuit block of the adjusting circuit shown in FIG. 1 in accordance with yet another embodiment of the disclosure.

FIG. 12 is a schematic diagram of the circuit block of the adjusting circuit 120 shown in FIG. 1 in accordance with yet another embodiment of the disclosure. In the embodiment shown in FIG. 12, the control signal Sc2 includes a control signal Sc2_1 and a control signal Sc2_2. The adjusting circuit 120 shown in FIG. 12 includes the interstage tuning circuit 122 and the attenuator 121. Based on the control of the control signal Sc2_2, the interstage tuning circuit 122 may tune an input signal (for example, the RF signal RFin) to generate a tuned signal RF1. The interstage tuning circuit 122 is controlled by the control signal Sc2_2 to adjust the gain and/or the linear power of the amplifying apparatus 100. The interstage tuning circuit 122 shown in FIG. 12 may be analogized with reference to the relevant descriptions of FIG. 11, and thus will not be reiterated.

In the embodiment shown in FIG. 12, the attenuator 121 is coupled to the interstage tuning circuit 122 to receive the tuned signal RF1. Based on the control of the control signal Sc2_1, the attenuator 121 may attenuate the tuned signal RF1 to generate the adjusted signal RF2. The attenuator 121 is controlled by the control signal Sc2_1 to adjust the gain of the amplifying apparatus 100. The attenuator 121 shown in FIG. 12 may be analogized with reference to the relevant descriptions of FIG. 5 to FIG. 10, and thus will not be reiterated.

The implementation method of the adjusting circuit 120 should not be limited to the embodiments described above. For example, in other embodiments, the input terminal of the attenuator 121 receives an input signal (for example, the RF signal RFin). The attenuator 121 may attenuate the RF signal RFin to generate an attenuated signal to the interstage tuning circuit 122. The input terminal of the interstage tuning circuit 122 is coupled to the output terminal of the attenuator 121. The interstage tuning circuit 122 may tune the attenuated signal of the attenuator 121 to generate a tuned signal (as the adjusted signal RF2) to the amplifying circuits (for example, the amplifying circuits 110_1 to 110_n shown in FIG. 1).

Figure 13:
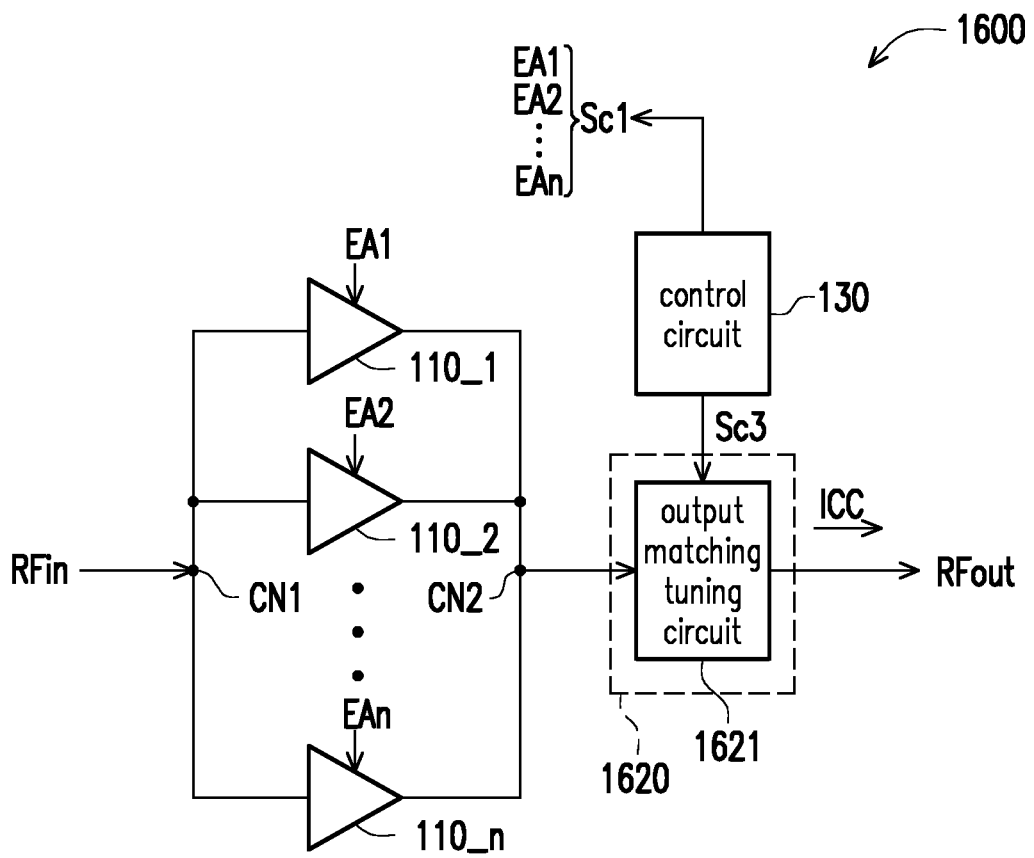
FIG. 13 is a schematic diagram of a circuit block of an amplifying apparatus in accordance with another embodiment of the disclosure.

FIG. 13 is a schematic diagram of a circuit block of an amplifying apparatus 1600 in accordance with another embodiment of the disclosure. The amplifying apparatus 1600 shown in FIG. 13 includes a plurality of amplifying circuits (for example, 110_1, 110_2, . . . , 110_n shown in FIG. 13) and an adjusting circuit 1620. The control circuit 130 is coupled to the amplifying circuits 110_1 to 110_n to provide the control signal Sc1. The amplifying circuits 110_1 to 110_n and the control circuit 130 shown in FIG. 13 may be analogized with reference to the relevant descriptions of FIG. 1 to FIG. 4, and thus will not be reiterated.

In the embodiment shown in FIG. 13, the adjusting circuit 1620 is configured to adjust the signal outputted by the amplifying circuits 110_1 to 110_n (i.e. the signal of the common node CN2) to generate an adjusted signal (for example, the RF signal RFout). The control circuit 130 is coupled to the adjusting circuit 1620 to provide a control signal Sc3. The adjusting circuit 1620 is controlled by the control signal Sc3 to adjust the gain and/or the linear power of the amplifying apparatus 1600. The gain and/or the linear power of the amplifying apparatus 1600 may be reduced (or increased) by the control signal Sc3.

The adjusting circuit 1620 shown in FIG. 13 includes an output matching tuning circuit 1621. The output matching tuning circuit 1621 may tune the signal outputted by the amplifying circuits 110_1 to 110_n (i.e. the signal of the common node CN2) to generate an adjusted signal (for example, the RF signal RFout). According to design requirements, the output terminal of the output matching tuning circuit 1621 may be coupled to the input terminal of another amplifying apparatus (not shown) or other circuit.

The output matching tuning circuit 1621 is controlled by the control signal Sc3 to adjust the gain and/or the linear power of the amplifying apparatus 100. The control circuit 130 may adjust the tuning characteristics of the output matching tuning circuit 1621 by the control signal Sc3. The output matching tuning circuit 1621 may tune the output impedance of the current stage and/or tune the input impedance of the next stage, so as to facilitate impedance matching. Based on the control of the control circuit 130, the gain and/or the linear power of the amplifying apparatus 100 may be reduced. The embodiment does not limit the implementation details of the output matching tuning circuit 1621. For example, according to design requirements, the output matching tuning circuit 1621 may be a conventional matching tuner or other signal matching circuit.

Figure 14:
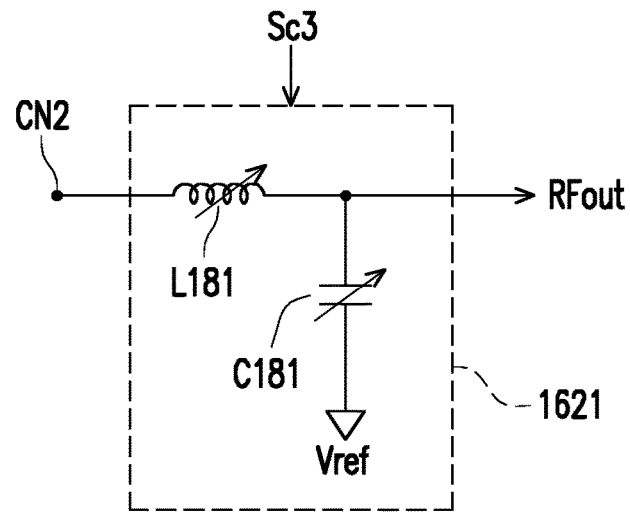
FIG. 14 is a schematic diagram of a circuit block of an output matching tuning circuit shown in FIG. 13 in accordance with an embodiment of the disclosure.

FIG. 14 is a schematic diagram of a circuit block of an output matching tuning circuit 1621 shown in FIG. 13 in accordance with an embodiment of the disclosure. In the embodiment shown in FIG. 14, the output matching tuning circuit 1621 includes an inductor L181 and a capacitor C181. The first terminal of the inductor L181 is coupled to the common node CN2. The second terminal of the inductor L181 provides an output signal (for example, the RF signal RFout) of the amplifying apparatus 1600. The first terminal of the capacitor C181 is coupled to the second terminal of the inductor L181. The second terminal of the capacitor C181 is coupled to the reference voltage terminal Vref. According to design requirements, in some embodiments, the voltage level of the reference voltage terminal Vref may be a ground voltage. One or both of the inductance value of the inductor L181 and the capacitance value of the capacitor C181 may vary according to the control of the control signal Sc3. The embodiment does not limit the implementation details of the inductor L181 and the capacitor C181. For example, according to design requirements, the inductor L181 may be a conventional variable inductor or other variable inductor, and/or the capacitor C181 may be a conventional variable capacitor or other variable capacitor. For example, the implementation details of the inductor L181 may be analogized with reference to the relevant descriptions of the induction circuit 1210 shown in FIG. 11, and/or the implementation details of the capacitor C181 may be analogized with reference to the relevant descriptions of the capacitance circuit 1220 shown in FIG. 11, and thus will not be reiterated.

According to different design requirements, the implementation of the block of the control circuit 130 may be hardware, firmware, software (i.e. program), or a combination of more than one of the three.

In terms of hardware, the circuit block of the control circuit 130 may be implemented in a logic circuit on an integrated circuit. The relevant functions of the control circuit 130 may be implemented as hardware using hardware description languages (for example, Verilog HDL or VHDL) or other suitable programming languages. For example, the relevant functions of the control circuit 130 may be implemented in one or more controllers, microcontrollers, microprocessors, application-specific integrated circuits (ASICs), digital signal processors (DSP), field programmable gate arrays (FPGA), and/or various logic blocks, modules, and circuits in other processing units.

In terms of software and/or firmware, the relevant functions of the control circuit 130 may be implemented as programming codes. For example, the control circuit 130 is implemented using normal programming languages, for example, C, C++, combined languages, or other suitable programming languages. The programming codes may be recorded/stored in a recording medium. The recording medium includes, for example, a read only memory (ROM), a storage apparatus, and/or a random access memory (RAM). A computer, a central processing unit (CPU), a controller, a microcontroller, or a microprocessor may read and execute the programming codes from the recording medium to accomplish the relevant functions. As the recording medium, a "non-transitory computer readable medium", for example, a tape, a disk, a card, a semiconductor memory, a programmable logic circuit, etc. may be used. Moreover, the program may also be provided to the computer (or CPU) via any transmission medium (communication network, broadcast radio wave, etc.). The communication network is, for example, the Internet, a wired communication, a wireless communication, or other communication medium.

Figure 15:
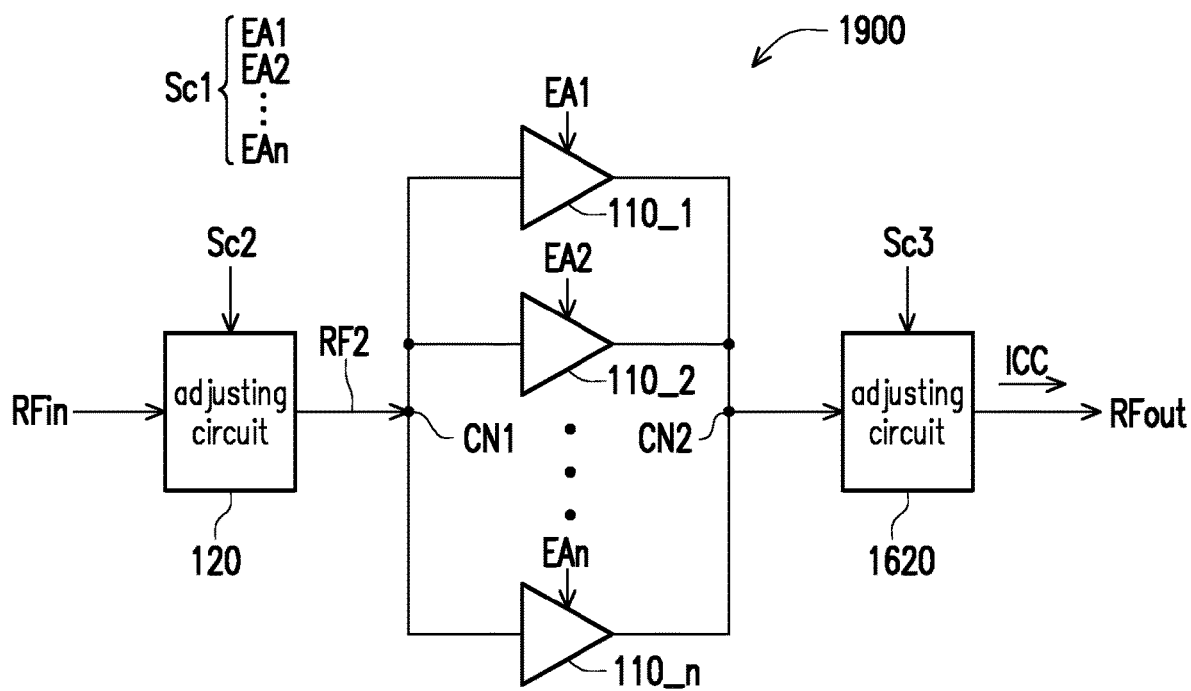
FIG. 15 is a schematic diagram of a circuit block of an amplifying apparatus in accordance with yet another embodiment of the disclosure.

FIG. 15 is a schematic diagram of a circuit block of an amplifying apparatus 1900 in accordance with yet another embodiment of the disclosure. The amplifying apparatus 1900 shown in FIG. 15 includes a plurality of amplifying circuits (for example, 110_1, 110_2, . . . , 110_n shown in FIG. 15) and an adjusting circuit. In the embodiment shown in FIG. 15, the adjusting circuit includes the adjusting circuit 120 and the adjusting circuit 1620. In the embodiment shown in FIG. 15, the adjusting circuit 120 is configured to adjust an input signal (for example, the RF signal RFin) to generate the adjusted signal RF2 to the common node CN1. In the embodiment shown in FIG. 15, the adjusting circuit 1620 is configured to adjust the signal outputted by the amplifying circuits 110_1 to 110_n (i.e. the signal of the common node CN2) to generate an adjusted signal (for example, the RF signal RFout). The amplifying circuits 110_1 to 110_n shown in FIG. 15 may be analogized with reference to the relevant descriptions of FIG. 1 to FIG. 4, the adjusting circuit 120 shown in FIG. 15 may be analogized with reference to the relevant descriptions of FIG. 1 and FIG. 5 to FIG. 12, the adjusting circuit 1620 may be analogized with reference to the related descriptions of FIGS. 13 and 14, and thus will not be reiterated.

Based on the above, the amplifying apparatus according to the embodiments of the disclosure may determine the operating mode of the amplifying apparatus by the control signals Sc1, Sc2, and/or Sc3. The control signal Sc1 may control a plurality of amplifying circuits 110_1 to 110_n connected in parallel with one another. That is, the control signal Sc1 may determine the number of enabled (or disabled) amplifying circuits 110_1 to 110_n to adjust the output current ICC and the linear power of the amplifying apparatus. The control signal Sc2 and/or Sc3 may control the adjusting circuit 120 and/or 1620 to adjust the gain and/or the linear power of the amplifying apparatus. Therefore, the amplifying apparatus may reduce the output current ICC and the linear power while reducing the gain, so as to reduce the power consumption of the amplifying apparatus, thereby accomplishing the objective of power saving.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An amplifying apparatus, comprising:
a plurality of amplifying circuits, wherein an input terminal of each of the plurality of amplifying circuits is coupled to a first common node and an output terminal of each of the plurality of amplifying circuits is coupled to a second common node; and
an adjusting circuit, wherein the adjusting circuit is configured to adjust an input signal to generate an adjusted signal to the first common node, the adjusting circuit is configured to adjust a signal of the second common node, or the adjusting circuit is configured to adjust the input signal to generate the adjusted signal to the first common node and adjust the signal of the second common node;
wherein the plurality of amplifying circuits are controlled by a first control signal, the adjusting circuit is controlled by a second control signal, the first control signal and the second control signal are used to determine a first operating mode and a second operating mode of the amplifying apparatus, and a gain and an output current of the amplifying apparatus in the first operating mode is greater than the gain and the output current of the amplifying apparatus in the second operating mode.

2. The amplifying apparatus according to claim 1, wherein a linear power of the amplifying apparatus in the first operating mode is greater than the linear power of the amplifying apparatus in the second operating mode.

3. The amplifying apparatus according to claim 1, wherein the adjusting circuit comprises at least one of an attenuator, an interstage tuning circuit, and an output matching tuning circuit.

4. The amplifying apparatus according to claim 3, wherein the attenuator comprises:

a first resistor having a first terminal for receiving the input signal;

a second resistor having a first terminal coupled to a second terminal of the first resistor, wherein a second terminal of the second resistor is coupled to the first common node; and a third resistor having a first terminal coupled to the second terminal of the first resistor, wherein a second terminal of the third resistor is coupled to a reference voltage terminal, wherein a resistance value of one or more than one of the first resistor, the second resistor, and the third resistor is varied according to a control of the second control signal.

5. The amplifying apparatus according to claim 4, wherein one of the first resistor, the second resistor, and the third resistor comprises:

a plurality of resistor units, wherein first terminals of the plurality of resistor units are electrically connected to each other; and a plurality of switches, wherein a first terminal of each of the plurality of switches is coupled to a second terminal of a corresponding resistor unit among the plurality of resistor units, second terminals of the plurality of switches are electrically connected to each other , and the plurality of switches is controlled by the second control signal.

6. The amplifying apparatus according to claim 3, wherein the attenuator comprises:

a first resistor having a first terminal for receiving the input signal, wherein a second terminal of the first resistor is coupled to the first common node;

a second resistor having a first terminal coupled to the first terminal of the first resistor, wherein a second terminal of the second resistor is coupled to a first reference voltage terminal; and a third resistor having a first terminal coupled to the second terminal of the first resistor, wherein a second terminal of the third resistor is coupled to a second reference voltage terminal, wherein a resistance value of one or more than one of the first resistor, the second resistor, and the third resistor is varied according to a control of the second control signal.

7. The amplifying apparatus according to claim 3, wherein the attenuator comprises:

a first resistor having a first terminal for receiving the input signal;

a second resistor having a first terminal coupled to a second terminal of the first resistor, wherein a second terminal of the second resistor is coupled to the first common node;

a third resistor having a first terminal coupled to the second terminal of the first resistor, wherein a second terminal of the third resistor is coupled to a reference voltage terminal; and a fourth resistor having a first terminal for receiving the input signal, wherein a second terminal of the fourth resistor is coupled to the first common node;

wherein a resistance value of one or more than one of the first resistor, the second resistor, the third resistor, and the fourth resistor is varied according to a control of the second control signal.

8. The amplifying apparatus according to claim 3, wherein the attenuator comprises:

a demultiplexer having a common terminal for receiving the input signal;

a plurality of couplers, wherein a first terminal of each of the plurality of couplers is coupled to a corresponding selective terminal among a plurality of selective terminals of the demultiplexer; and a multiplexer having a common terminal coupled to the first common node, wherein a second terminal of each of the plurality of couplers is coupled to a corresponding selective terminal among a plurality of selective terminals of the multiplexer, wherein the demultiplexer and the multiplexer change routing according to a control of the second control signal.

9. The amplifying apparatus according to claim 3, wherein the interstage tuning circuit comprises:

an induction circuit having a first terminal for receiving the input signal, wherein a second terminal of the induction circuit is coupled to the first common node; and a capacitance circuit having a first terminal coupled to the second terminal of the induction circuit, wherein a second terminal of the capacitance circuit is coupled to a reference voltage terminal, wherein one or both of an inductance value of the induction circuit and a capacitance value of the capacitance circuit is varied according to a control of the second control signal.

10. The amplifying apparatus according to claim 9, wherein the induction circuit comprises:

a first inductor having a first terminal for receiving the input signal, wherein a second terminal of the first inductor is coupled to the first common node;

a switch having a first terminal coupled to the first terminal of the first inductor; and a second inductor having a first terminal coupled to a second terminal of the switch, wherein a second terminal of the second inductor is coupled to the second terminal of the first inductor.

11. The amplifying apparatus according to claim 9, wherein the capacitance circuit comprises:

a first capacitor having a first terminal coupled to the second terminal of the induction circuit, wherein a second terminal of the first capacitor is coupled to the reference voltage terminal;

a switch having a first terminal coupled to the first terminal of the first capacitor; and a second capacitor having a first terminal coupled to a second terminal of the switch, wherein a second terminal of the second capacitor is coupled to the reference voltage terminal.

12. The amplifying apparatus according to claim 3, wherein the output matching tuning circuit comprises:

an inductor having a first terminal coupled to the second common node, wherein a second terminal of the inductor provides an output signal of the amplifying apparatus; and a capacitor having a first terminal coupled to the second terminal of the inductor, wherein a second terminal of the capacitor is coupled to a reference voltage terminal, wherein one or both of an inductance value of the inductor and a capacitance value of the capacitor is varied according to a control of a third control signal.

13. The amplifying apparatus according to claim 3, wherein an output terminal of the output matching tuning circuit is configured to be coupled to an input terminal of another amplifying apparatus.

14. The amplifying apparatus according to claim 1, wherein an input terminal of the adjusting circuit is configured to be coupled to an output terminal of another amplifying apparatus.

15. The amplifying apparatus according to claim 1, further comprising:
a bias voltage generating circuit configured to generate a bias to a control terminal of an input transistor of each of the plurality of amplifying circuits,
wherein the bias voltage generating circuit is controlled by the first control signal to adjust the bias.

16. The amplifying apparatus according to claim 15, wherein the bias voltage generating circuit comprises:
a reference voltage circuit controlled by the first control signal to adjust and output a first reference voltage;
a resistance circuit having a first terminal coupled to the reference voltage circuit to receive the first reference voltage;
a diode circuit having a first terminal and a second terminal respectively coupled to a second terminal of the resistance circuit and a second reference voltage terminal; and
a transistor having a control terminal coupled to the second terminal of the resistance circuit, wherein a first terminal of the transistor is coupled to a third reference voltage terminal, and a second terminal of the transistor is coupled to the control terminal of the input transistor.

17. The amplifying apparatus according to claim 1, wherein
the first control signal includes or be used to generate an enable signal of each of the plurality of amplifying circuits, and
a number of enabled amplifying circuits among the plurality of amplifying circuits when the amplifying apparatus is operating in the first operating mode is greater than the number of the enabled amplifying circuits among the plurality of amplifying circuits when the amplifying apparatus is operating in the second operating mode.

18. The amplifying apparatus according to claim 17, wherein each of the plurality of amplifying circuits comprises:
a switch having a first terminal coupled to the first common node, wherein the switch is controlled by the enable signal; and
an input transistor having a control terminal coupled to a second terminal of the switch.

19. The amplifying apparatus according to claim 17, wherein each of the plurality of amplifying circuits comprises:
an input transistor having a control terminal coupled to the first common node; and
a switch having a first terminal coupled to the control terminal of the input transistor, wherein a second terminal of the switch is coupled to a bias voltage terminal, and the switch is controlled by the enable signal.

20. The amplifying apparatus according to claim 17, wherein each of the plurality of amplifying circuits comprises:
an input transistor having a control terminal coupled to the first common node; and
a switching circuit having a common terminal coupled to the control terminal of the input transistor, wherein a first selective terminal of the switching circuit is coupled to a bias voltage terminal, a second selective terminal of the switching circuit is coupled to a reference voltage terminal, the switching circuit is controlled by the enable signal, and the input transistor is turned off when the switching circuit transmits a voltage of the reference voltage terminal to the control terminal of the input transistor.

* * * * *